(12) United States Patent
Lu et al.

(10) Patent No.: US 6,677,165 B1
(45) Date of Patent: Jan. 13, 2004

(54) MAGNETORESISTIVE RANDOM ACCESS MEMORY (MRAM) CELL PATTERNING

(75) Inventors: Yong Lu, Rosemount, MN (US); Theodore Zhu, Mission Viejo, CA (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 10/393,713

(22) Filed: Mar. 20, 2003

(51) Int. Cl.[7] .......................................... H01L 21/8242
(52) U.S. Cl. ............................ 438/3; 438/73; 438/629; 438/637; 438/701; 438/758
(58) Field of Search ............................ 438/3, 73, 240, 438/396, 629, 637, 694, 700, 702, 703, 758

(56) References Cited

U.S. PATENT DOCUMENTS

| | | | |
|---|---|---|---|
| 6,338,899 B1 | * | 1/2002 | Fukuzawa et al. .......... 428/332 |
| 6,365,286 B1 | * | 4/2002 | Inomata et al. ............. 428/692 |
| 6,528,326 B1 | * | 3/2003 | Hiramoto et al. .............. 438/3 |
| 2001/0022373 A1 | * | 9/2001 | Minakata et al. ........... 257/295 |
| 2002/0076572 A1 | * | 6/2002 | Engelhardt et al. ......... 428/607 |
| 2002/0135948 A1 | * | 9/2002 | Funayama et al. ....... 360/324.1 |
| 2002/0191354 A1 | * | 12/2002 | Yoshikawa et al. ...... 360/324.1 |
| 2003/0119210 A1 | * | 6/2003 | Yates et al. .................... 438/3 |
| 2003/0128483 A1 | * | 7/2003 | Kamijo .................. 360/324.11 |

* cited by examiner

Primary Examiner—George Fourson
Assistant Examiner—Joannie Adelle Garcia
(74) Attorney, Agent, or Firm—Knobbe, Martens, Olson, & Bear, LLP (57) ABSTRACT

A process that advantageously forms MRAM cells without the application of ion beam milling processes. Unlike conventional processes that rely on ion beam milling processes to remove materials from a magnetoresistive sandwich from areas other than areas that will later form MRAM cell bodies, this process forms a layer of photoresist over areas other than those areas that correspond to MRAM cell bodies. The photoresist is lifted off after the deposition of a magnetoresistive sandwich that forms the MRAM cell bodies, thereby safely removing the magnetoresistive sandwich from undesired areas while maintaining the magnetoresistive sandwich in the areas corresponding to MRAM cell bodies.

11 Claims, 8 Drawing Sheets

MAGNETORESISTIVE RANDOM ACCESS MEMORY (MRAM) CELL PATTERNING

BACKGROUND OF THE INVENTION

1. Field of the Invention

The invention generally relates to memory technology. In particular, the invention relates to non-volatile magnetic memory.

2. Description of the Related Art

Computers and other digital systems use memory to store programs and data. A common form of memory is random access memory (RAM), such as dynamic random access memory (DRAM) devices and static random access memory (SRAM) devices. DRAM devices and SRAM devices are volatile memories. A volatile memory loses its data when power is removed. For example, when a conventional personal computer is powered off, the volatile memory is reloaded through a boot up process. In addition, certain volatile memories such as DRAM devices require periodic refresh cycles to retain their data even when power is continuously supplied.

In contrast to the potential loss of data encountered in volatile memory devices, nonvolatile memory devices retain data for long periods of time when power is removed. Examples of nonvolatile memory devices include read only memory (ROM), programmable read only memory (PROM), erasable PROM (EPROM), electrically erasable PROM (EEPROM), flash memory, and the like. Disadvantageously, conventional nonvolatile memories are relatively large, slow, and expensive. Further, conventional nonvolatile memories are relatively limited in write cycle capability and typically can only be programmed to store data about 10,000 times in a particular memory location. This prevents a conventional non-volatile memory device, such as a flash memory device, from being used as general purpose memory.

An alternative memory device is known as magnetoresistive random access memory (MRAM). An MRAM device uses magnetic orientations to retain data in its memory cells. Advantageously, MRAM devices are relatively fast, are nonvolatile, consume relatively little power, and do not suffer from a write cycle limitation. There are at least three different types of MRAM devices, including giant magneto-resistance (GMR) MRAM devices, magnetic tunnel junction (MTJ) or tunneling magneto-resistance (TMR) MRAM devices, and pseudo spin valve (PSV) MRAM devices. GMR MRAM devices separate at least two ferromagnetic layers with a metallic layer. In a MTJ MRAM device, at least two ferromagnetic layers are separated by a thin insulating tunnel barrier. A PSV MRAM device uses an asymmetric sandwich of the ferromagnetic layers and metallic layer as a memory cell, and the ferromagnetic layers do not switch at the same time.

In a conventional fabrication process, layers of materials that form a magnetoresistive sandwich for an MRAM cell body are formed by depositing a relatively large sheet of magnetoresistive materials. Conventional processes then selectively remove portions of the deposited sheet to form the MRAM cell bodies. Preferably, chemical etching techniques are used to selectively remove portions of deposited sheets. Examples of chemical etching techniques include dry etching techniques and wet etching techniques. However, such chemical etching techniques are not applicable to the fabrication of MRAM cells because the materials that are used to fabricate MRAM cells are relatively difficult to etch away with chemicals. For example, copper (Cu) is relatively difficult to remove by a chemical etching process.

Those in the art have resorted to ion beam milling or ion beam etching (IBE) processes to remove magnetoresistive materials from undesired areas. Ion beam milling is a physical milling process. A resist material is applied to regions that will form cells to protect or mask the regions from the effects of ion beam milling. Areas that are not protected by the resist are removed from the substrate assembly by bombardment with ions. The bombardment of ions sputters or peels away the unprotected material from the substrate assembly. Disadvantageously, ion beam milling operates with relatively low selectivity, and the portions of the substrate assembly that are near to the edges of the photoresist or the boundaries of an MRAM cell body can be easily damaged. The damage can result in a cell in which an edge of the cell and a center of the cell do not switch in unison. In addition, ion beam milling etch rates are relatively low, which results in relatively high costs and relatively low throughput rates.

A technique is needed to form MRAM cells without the disadvantages of ion beam milling.

SUMMARY OF THE INVENTION

The invention relates to processes that advantageously form MRAM cells without the application of an ion bean milling process. Conventional processes rely on relatively slow and potentially harmful ion beam milling processes to remove materials from a magnetoresistive sandwich from areas proximate to other areas that will later form MRAM cell bodies. By contrast, a process according to an embodiment of the invention forms a layer of photoresist over areas other than those areas that correspond to MRAM cell bodies. The photoresist is removed by a lift-off process after the deposition of a magnetoresistive sandwich that forms the MRAM cell bodies, thereby safely removing the magnetoresistive sandwich from undesired areas while maintaining the magnetoresistive sandwich in the areas that will eventually become MRAM cell bodies.

One embodiment according to the invention is a process that produces a cell body in a magnetoresistive random access memory (MRAM). Advantageously, the process can produce either GMR or TMR cell bodies without resorting to ion beam milling processes.

The process begins by forming an insulating layer, such as a layer of silicon nitride ($Si_3N_4$), on a substrate assembly. The process patterns a trench in the insulating layer, which is adapted to accommodate a cell body that is to be formed. The substrate assembly can include a word line below the trench. In one embodiment, the trench further includes a window or an opening that allows a cell body that is later formed to make electrical contact with the word line.

The process forms a layer of photoresist over the insulating layer. The process removes portions of the photoresist layer that cover an area where the cell body is to be formed. A magnetoresistive sandwich is then formed on the substrate assembly. The magnetoresistive sandwich can be formed by physical vapor deposition (PVD) processes, chemical vapor deposition processes, and the like. The undesired portions of the magnetoresistive sandwich are removed from the substrate assembly by removing the remaining portions of the photoresist layer.

Another embodiment according to the invention is a process that forms magnetoresistive cell bodies in an insulating material, such as an insulating layer on a substrate assembly. The process begins by forming trenches in an insulating material. The bottom surfaces of the trenches correspond to first regions of the insulating material, where magnetoresistive cell bodies are to be formed. The process applies photoresist to second regions of the insulating material. The second regions correspond to areas where layers that form the magnetoresistive sandwich are not intended to remain. The process proceeds to form a sandwich of magnetoresistive materials on both the first regions and the second regions. Advantageously, the process then removes the sandwich of magnetoresistive materials from the second regions without resorting to an ion beam milling process. The process removes the sandwich of magnetoresistive materials from the second regions by removing the photoresist that had been applied to the second regions. A variety of processes, such as photoresist stripping processes and micromachining processes can be used to remove the photoresist.

Another embodiment according to the invention includes a partially completed magnetoresistive random access memory (MRAM). The partially completed MRAM includes a substrate assembly, an insulating layer on a top surface of the substrate assembly, a trench formed in the insulating layer, and a photoresist layer formed on the insulating layer. In one embodiment, the substrate assembly includes a word line that has been formed beneath the trench. The trench is adapted to accommodate at least one magnetoresistive cell body.

Another embodiment according to the invention includes a partially completed magnetoresistive random access memory (MRAM). The partially completed MRAM includes a substrate assembly, an insulating layer on a top surface of the substrate assembly, at least one trench, and a photoresist layer on a top surface of the insulating layer. The photoresist layer does not cover the bottom surface of the trench, which is adapted to accommodate at least one magnetoresistive cell body.

Another embodiment according to the invention includes a partially completed magnetoresistive random access memory (MRAM). The partially completed MRAM includes a substrate assembly, an insulating layer formed on a top surface of the substrate assembly, at least one trench, a photoresist layer, and a magnetoresistive sandwich. The trench is formed in the insulating layer and is adapted to accommodate at least one magnetoresistive cell body. The photoresist layer is present on a top surface of the substrate assembly, but is not present on a bottom surface of the trench. The magnetoresistive sandwich is formed on the photoresist layer and on the bottom surface of the trench.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

DETAILED DESCRIPTION OF THE PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

A magnetoresistive random access memory (MRAM) stores data in magnetic states of its memory cells. The electrical resistance of the cell depends on the stored magnetic state of the cell. The stored state of the cell is detected by sensing a difference in resistance.

While illustrated in the context of giant magneto-resistance (GMR) memories, the skilled artisan will appreciate that the principles and advantages described herein are applicable to other types of magnetic memories, such as tunneling magneto-resistance (TMR) MRAMs.

Figure 1:
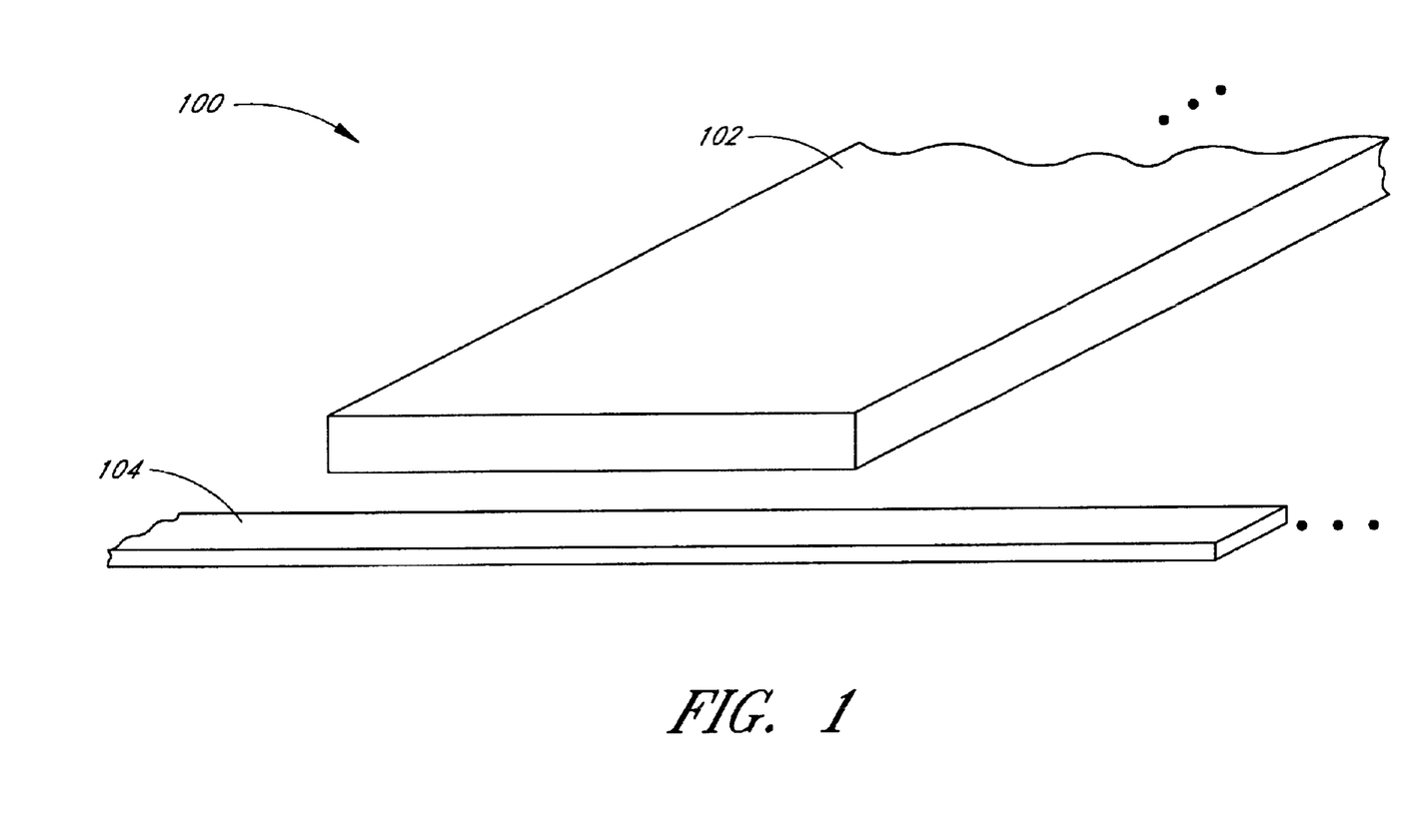
FIG. 1 is a perspective view illustrating a giant magneto-resistance (GMR) cell in a spin valve mode.

FIG. 1 is a perspective view illustrating a GMR cell 100 in a spin valve mode. The GMR cell 100 includes a word line 102 and a bit line 104. In a GMR cell, the bit line 104 is also known as a sense line. The bit line 104 contains magnetic layers. Data is stored in a cell body portion of the bit line 104 by simultaneously applying current through the word line 102 and the bit line 104. The direction of the current in the word line 102 (and the consequent magnetic field applied) can determine the polarization of the magnetic orientation that stores the logical state of the data while the current in the bit line 104 assists the writing process. For example, the applied field component from the word line current can be clockwise around the word line 102 for a first current direction, and counterclockwise around the word line 102 for a second current direction. The additional magnetic field applied from the bit line 104 can be used to select a cell in an array of cells. Where the magnetic memory cell corresponds to a tunneling magneto-resistance (TMR) configuration, a TMR cell is disposed between the bit line 104 and the word line 102.

To read data from the GMR cell 100, current can again be applied to the bit line 104 corresponding to the GMR cell 100. In some embodiments, such as pseudo spin valve GMR cells, currents can be applied to both the word line 102 and to the bit line 104 corresponding to the GMR cell 100 to read a stored state of the cell. In one configuration of an array of cells, where multiple cells can share a word line or a bit line, a combination of word line current and bit line current can be used to select and to read a state from a cell in the array. The resistance encountered by the current applied to the bit line 104 depends on the logical state stored in the magnetic layers. The current through a cell with a larger resistance causes a larger voltage drop than the current through a cell with a smaller resistance.

Figure 2:
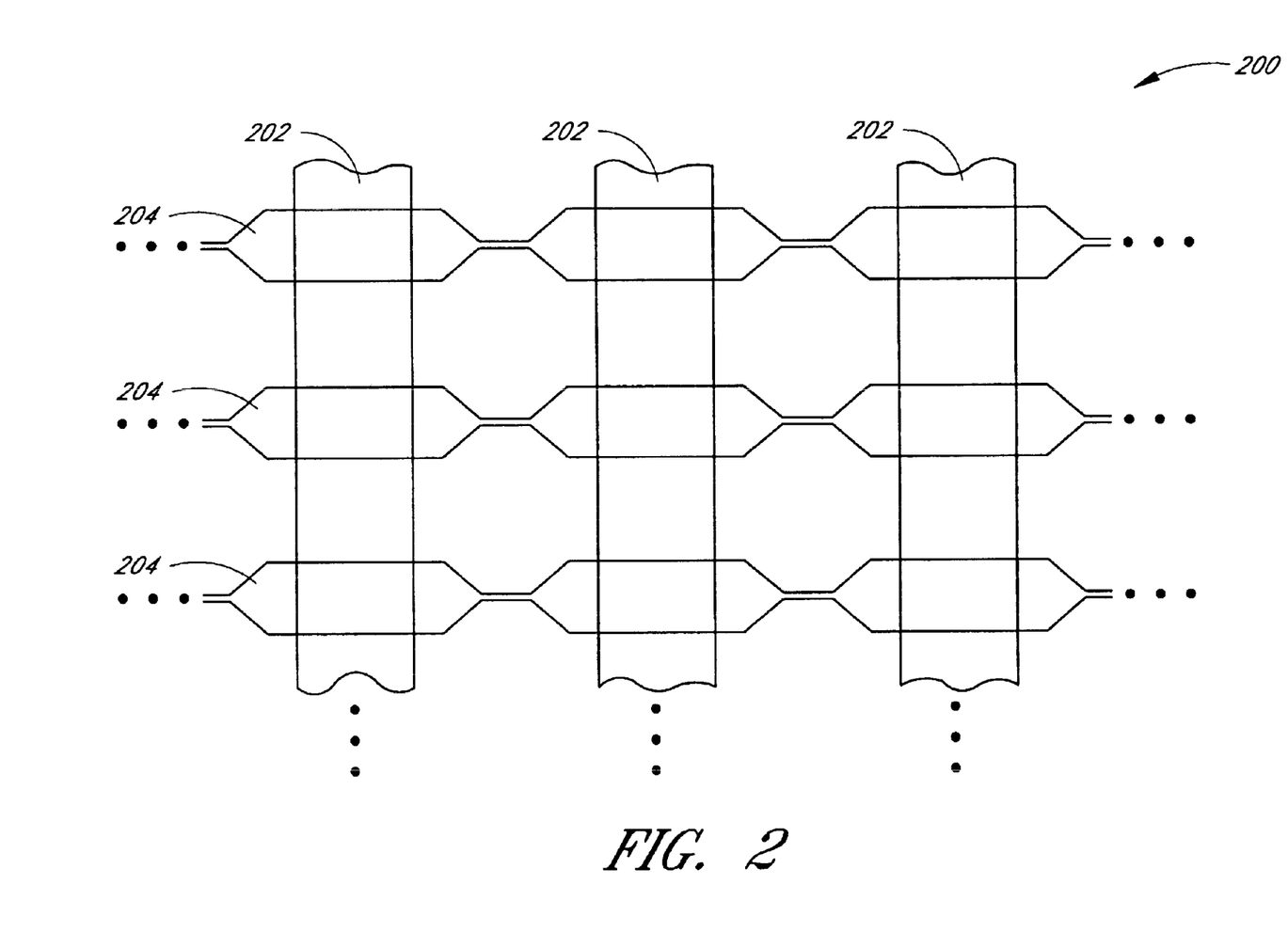
FIG. 2 is a schematic top-down view illustrating an array of GMR cells.

FIG. 2 is a schematic top-down view illustrating an array 200 of GMR cells. A plurality of cells are arranged into the array 200 in a memory device. The array 200 of cells includes a plurality of word lines 202 and a plurality of bit lines 204. An individual cell within the array 200 is selected by applying current through the corresponding word line and the corresponding bit line. Data is not stored or read in a cell where current flows through only the word line of the cell or through only the bit line of the cell.

Figure 3A:
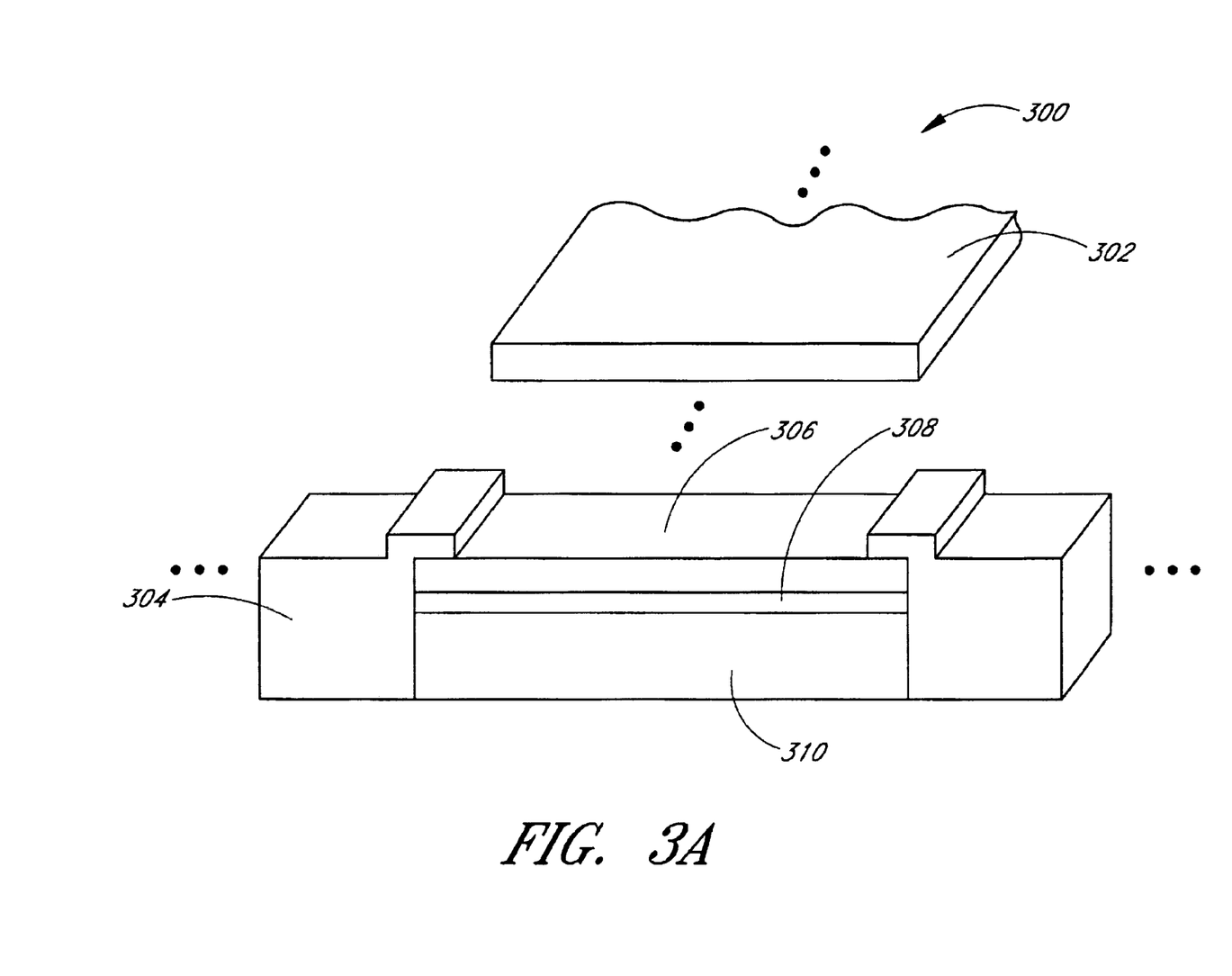
FIG. 3A illustrates a GMR cell in a pseudo spin valve (PSV) mode.

FIG. 3A illustrates a GMR cell 300 in a pseudo spin valve (PSV) mode. The GMR cell 300 includes a word line 302 and a bit line 304. The bit line 304 of the GMR cell 300, which is also known as a sense line, further includes a GMR stack including a first magnetic layer 306, a conductive layer 308, and a second magnetic layer 310. The first magnetic layer 306 and the second magnetic layer 310 are mismatched so that the first magnetic layer 306 is magnetically "softer" than the second magnetic layer 310. The mismatch in magnetic properties can be obtained by making the first magnetic layer 306 relatively thin as compared to the second magnetic layer 310, by selecting a relatively soft magnetic material for the first magnetic layer 306 and a relatively hard magnetic material for the second magnetic layer 310, or by making the first magnetic layer 306 thinner and magnetically softer than the second magnetic layer 310. Other terms used to describe a "hard layer" include "pinned layer" and "fixed layer." However, it will be understood by one of ordinary skill in the art that the stored magnetic orientation in a hard layer can be varied in accordance with the logical state of the stored data. Other terms used to describe a "soft layer" include "variable layer" and "flipped layer." It will be understood by one of ordinary skill in the art that the GMR stack can further include multiple layers of ferromagnetic materials and spacers.

The GMR cell 300 stores data as a magnetic orientation in the second magnetic layer 310. A relatively high magnetic field is required to switch the magnetization of the second magnetic layer 310 so that the magnetization remains fixed in operation. The magnetic state of the GMR cell 300 is switched by switching the magnetization of the first magnetic layer 306, which can be switched with a relatively low magnetic field generated by applying a current to the corresponding word line 302 and applying a current to the corresponding bit line 304. The resulting magnetization of the first magnetic layer 306 is either parallel or anti-parallel to the magnetization of the second magnetic layer 310. When the magnetization in the first magnetic layer 306 is parallel with the magnetization of the second magnetic layer 310, the electrical resistance of the GMR cell 300 is lower than when the magnetization of the first magnetic layer 306 is relatively anti-parallel to the magnetization of the second magnetic layer 310. Current in the word line 302 and/or the bit line 304 can be switched in both directions to correspondingly switch the magnetization of the first magnetic layer 306 (i.e., the soft magnetic layer) between parallel and anti-parallel states. The difference in electrical resistance of the bit line 304 is then sensed, thereby allowing the stored logical state of the GMR cell 300 to be retrieved.

Figure 3B:
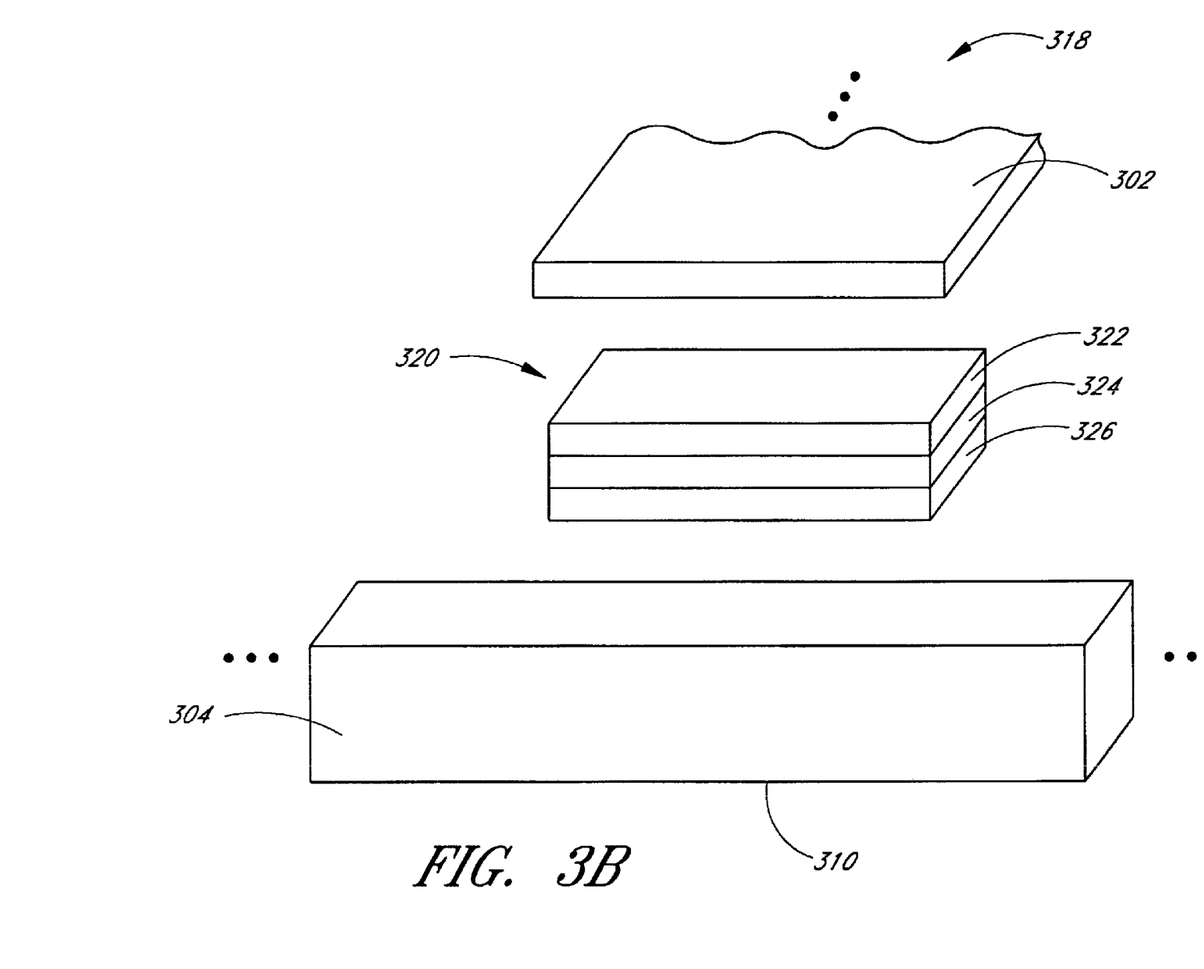
FIG. 3B illustrates a TMR cell in a cross point.

FIG. 3B illustrates a TMR cell 318 in a cross point architecture. In a TMR memory cell, a cell body is formed between the bit line and the word line, and the conductive layer 308 of FIG. 3A is replaced by a relatively thin insulating layer, which is thin enough to allow the tunneling of electrons from one magnetic layer to the other magnetic layer to detect memory states. The TMR cell 318 includes a TMR cell body 320 that is disposed between the word line 302 and the bit line 304. The TMR cell body 320 includes a first layer of ferromagnetic material 322, an insulating spacer layer 324, and a second layer of ferromagnetic material 326. The insulating spacer layer 324 is disposed between the first layer of ferromagnetic material 322 and the second layer of ferromagnetic material 326.

Figure 4:
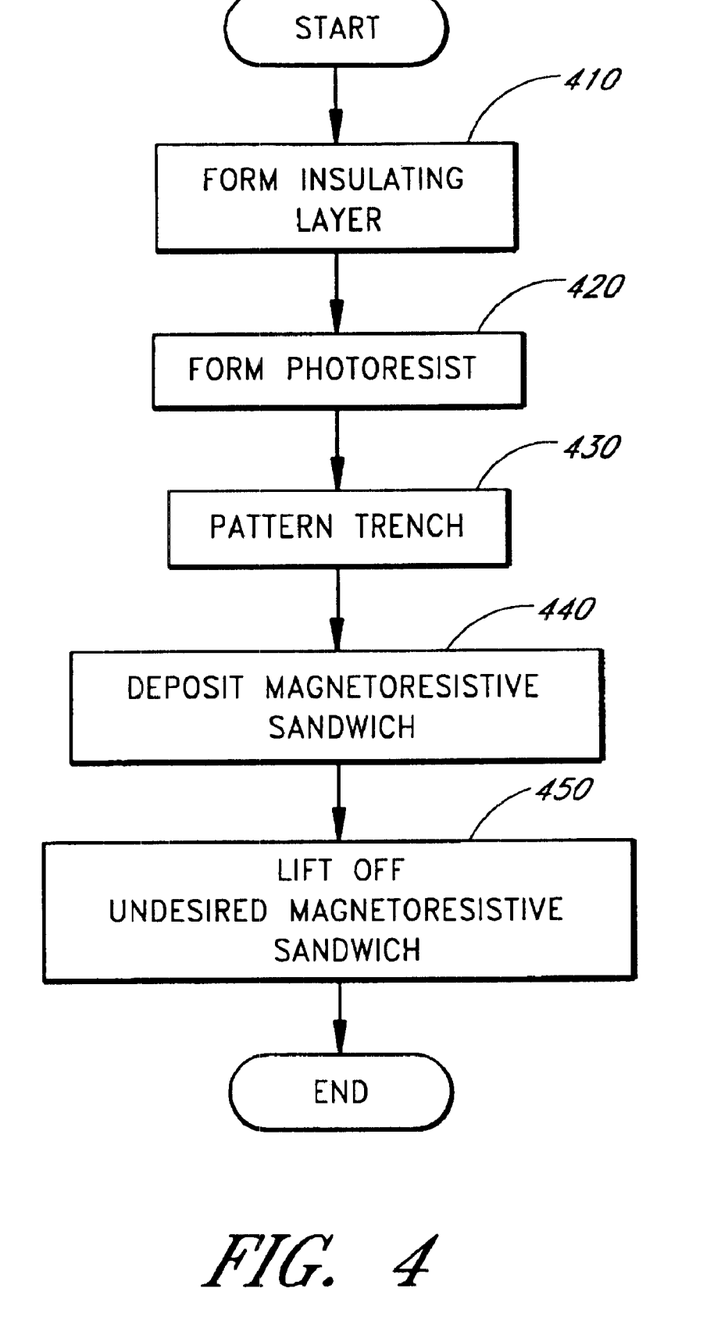
FIG. 4 is a flowchart, generally illustrating a process for producing a magnetoresistive random access memory (MRAM) cell without ion beam milling.

FIG. 4 is a flowchart that generally illustrates a process for producing a magnetoresistive random access memory (MRAM) cell without application of an ion beam milling process. Advantageously, the elimination of ion beam milling from the process allows the MRAM cell to be produced at relatively high throughput rates and eliminates damage caused by ion beam milling to the portion of the cell at the boundary between the photoresist and the cell.

The process starts by forming 410 an insulating layer on a substrate assembly. The substrate assembly can include a relatively large wafer upon which multiple MRAM cells and multiple MRAM devices can be made. A broad variety of materials can be used to form the insulating layer, such as silicon nitride ($Si_3N_4$). Examples of processes that can be used to form the insulating layer include low pressure chemical vapor deposition (LPCVD) and plasma-enhanced chemical vapor deposition (PECVD).

The process then forms 420 a layer of photoresist on the insulating layer. In contrast to conventional photoresist and ion beam milling techniques, the process forms 420 the layer of photoresist before, rather than after, the deposition of the magnetic material layers of the MRAM cell. A cross-sectional view of an insulating layer with the photoresist applied is described later in connection with FIG. 5A. Regions of the photoresist are selectively exposed to ultra-violet (UV) light by alignment of a mask, and the portions of the photoresist that are soluble after the UV exposure are dissolved by a chemical developer or photoresist stripper. A cross-sectional view of an insulating layer with the photoresist selectively removed is described later in connection with FIG. 5B.

The process then patterns 430 a trench in the insulating layer. The substrate assembly can include a word line formed below the trench. It will be understood by one of ordinary skill in the art that in a GMR application, a word line is insulated from a magnetoresistive cell formed in the trench by, for example, the insulating layer itself, but that in a TMR application, the word line is electrically coupled, either directly with a contact or through a plug, to a TMR cell formed in the trench. In addition, the skilled practitioner will also appreciate that a word line can be formed after the magnetoresistive cell is formed by the process depicted in FIG. 4.

The trench can correspond to a relatively long and narrow track that is formed in the insulating layer. However, one of ordinary skill in the art will appreciate that the term "trench" can also refer to other shapes, such as a relatively short well including a cavity, that is formed in the insulating layer. In one embodiment, the trench corresponds to one or more such cavities. A variety of techniques can be used to create the trench. In one embodiment, an etching process is used to form the trench. The etching process can use a fluorine-based gas, such as carbon tetrafluoride ($CF_4$). Other gases that can be used to etch the trench include $CF_4/O_2$, $SF_6$, $C_2F_6/O_2$, $NF_3$, $SiF_4$, $CHF_3$, and $C_2F_6$. A cross-sectional view of a trench formed in an insulating layer is described later in connection with FIG. 5C. In addition, a window can be opened in the insulating layer to allow the word line to make electrical continuity to a TMR cell formed as by the magnetoresistive layers.

The process proceeds to deposit 440 the layers of the magnetoresistive sandwich of the MRAM cell. A variety of materials can be deposited to form the magnetoresistive sandwich of the MRAM cell. The magnetoresistive sandwich includes at least three layers, but can include multiple layers. For example, where the MRAM cell corresponds to a giant magneto-resistance (GMR) cell, the magnetoresistive sandwich can include a first layer of permalloy (NiFe), a second spacer layer of a conductor, such as copper (Cu), and a third layer of permalloy (NiFe). In another example, where the MRAM cell corresponds to a tunneling magneto-resistance (TMR) cell, the magnetoresistive sandwich can include a first layer of permalloy (NiFe), a second spacer layer of an insulator or dielectric, such as alumina ($Al_2O_3$), and a third layer of permalloy (NiFe). Examples of other materials that can be used in the first layer and the third layer include cobalt (Co), cobalt iron (CoFe), cobalt nickel iron (CoNiFe), and the like. However, it will be understood by one of ordinary skill in the art that an almost endless variety of magnetoresistive structures exist, and the magnetoresistive sandwich can further include other layers, such as barrier layers and multiple layers in the magnetoresistive sandwich.

A variety of processes can be used to deposit the magnetoresistive layers. Applicable processes for forming metallic layers include chemical vapor deposition (CVD) techniques, including low pressure chemical vapor deposition (LPCVD) techniques, and physical vapor deposition (PVD) techniques, such as sputtering. Sputtering and oxidation can be used to form alumina in a dielectric layer, such as a tunneling layer in a TMR cell. A cross-sectional view of an insulating layer with the magnetoresistive sandwich formed thereon is described later in connection with FIG. 5D.

The process then removes 450 regions of the magnetoresistive sandwich selected from areas other than the bottom surfaces of the trenches. The process removes the selected regions of the magnetoresistive sandwich by removing the photoresist upon which the undesired portions of the magnetoresistive sandwich are deposited. A variety of photoresist stripping techniques can be used to remove the photoresist. For example, a photoresist stripper can be applied to remove the photoresist. In another embodiment, semiconductor micromachining processes are used to remove the magnetoresistive sandwich and the photoresist.

A cross-sectional view of an insulating layer with the undesired magnetoresistive sandwich lifted off is described later in connection with FIG. 5E. It will be understood by one of ordinary skill in the art that word lines can be formed above or below the MRAM cell. Also, the skilled practitioner will appreciate that multiple cells can be connected together in series to form a sense line in a GMR RMAM memory device and that multiple cells can be coupled to a bit line in a TMR MRAM memory device. Relatively short conductors can be used to connect the MRAM cells.

Figure 5A:
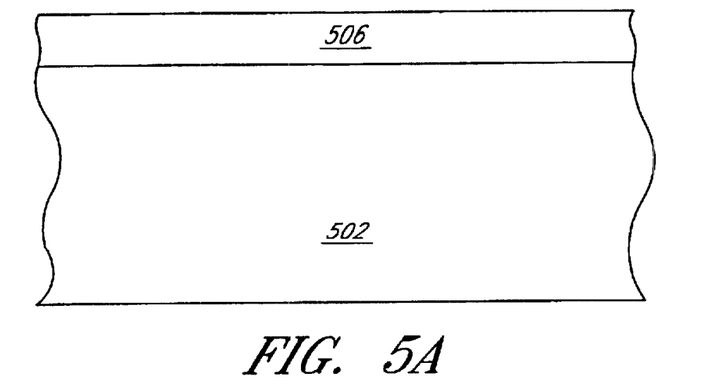
FIG. 5A is a cross-sectional view of an MRAM cell at an intermediate stage in fabrication, illustrating a layer of photoresist applied over a substrate assembly.

FIG. 5A is a cross-sectional view of an MRAM cell at an intermediate stage in fabrication. An insulating layer 502 can be formed on a substrate assembly by applying an insulator or dielectric, such as silicon nitride ($Si_3N_4$). A layer of photoresist 506 is formed above the insulating layer 502. The photoresist 506 can be initially deposited as a sheet of photoresist with a relatively uniform thickness on the surface of the insulating layer 502.

Figure 5B:
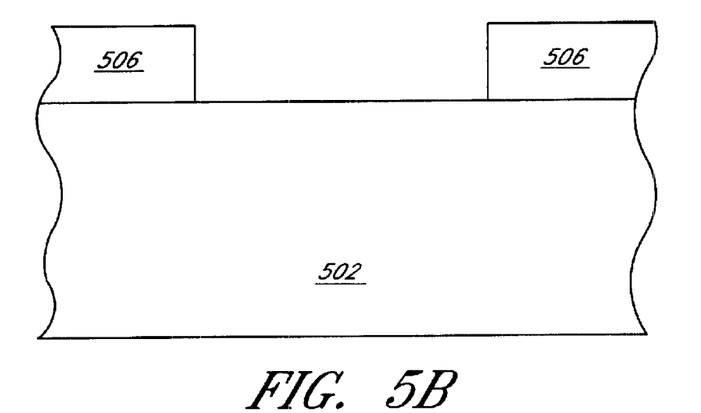
FIG. 5B is a cross-sectional view of the MRAM cell illustrated in FIG. 5A, after patterning of the layer of a photoresist.

FIG. 5B is a cross-sectional view of the partially formed MRAM cell illustrated in FIG. 5A, after patterning of the layer of photoresist 506. Portions of the photoresist 506 can be selectively removed. A variety of techniques, including conventional techniques, such as an alignment of a mask, an exposure to UV radiation, and a dissolving of soluble photoresist with chemical developing solutions or photoresist strippers, can be used to selectively remove the photoresist 506 from the insulating layer 502.

Figure 5C:
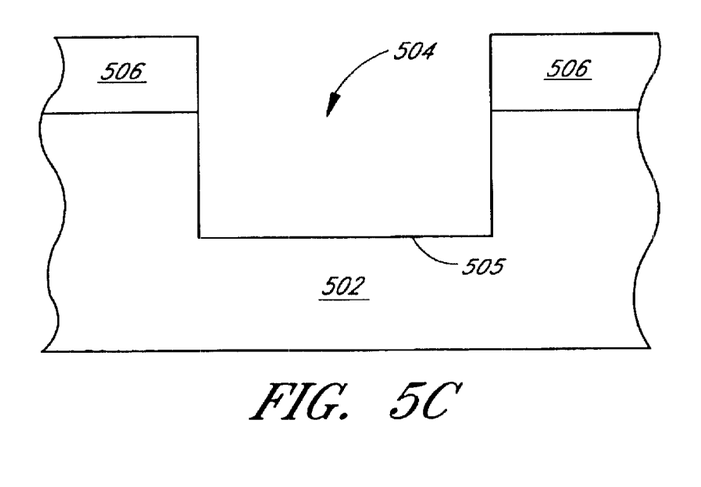
FIG. 5C is a cross-sectional view of the MRAM cell illustrated in FIG. 5B, after forming a trench.

FIG. 5C is a cross-sectional view of the partially formed MRAM cell illustrated in FIG. 5B, after forming a trench 504 in the insulating layer 502. Advantageously, the photoresist 506 is not present at a bottom surface 505 of the trench 504 so that an MRAM cell body can be later formed in the trench 504 of the insulating layer 502. The absence of the photoresist 506 from the bottom surface 505 permits a magnetoresistive sandwich to adhere to the bottom surface 505 of the trench 504. In one embodiment, the trench 504 corresponds to a relatively long and narrow channel in which a multiple MRAM cells are formed. In another embodiment, the trench corresponds to other shapes, such as to a plurality of relatively short wells or cavities, in which individual MRAM cells are formed. It will also be understood by one of ordinary skill in the art that the intermediate structure depicted in FIG. 5C can be formed in a variety of ways. For example, in another embodiment, the trench can be formed first, the photoresist can be applied, and the photoresist can be patterned such that the photoresist is removed from the bottom of the trench.

Figure 5D:
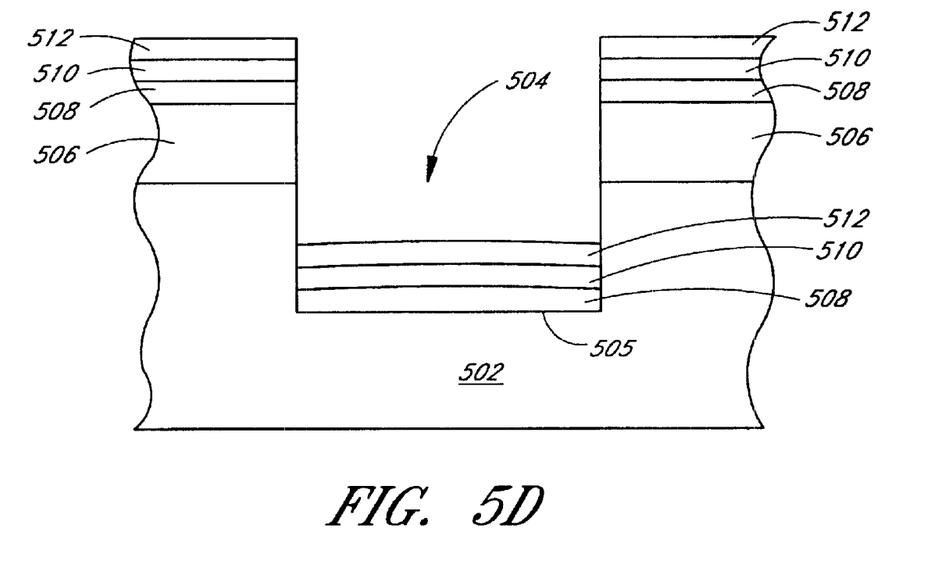
FIG. 5D is a cross-sectional view of the MRAM cell illustrated in FIG. 5C, after deposition of a magnetoresistive sandwich.

FIG. 5D is a cross-sectional view of the MRAM cell illustrated in FIG. 5C, after deposition of a magnetoresistive sandwich. For example, the magnetoresistive sandwich can include a first layer 508, a second layer 510 and a third layer 512. In a particular embodiment, the first layer 508 can correspond to a "hard" magnetic layer. In a GMR device, the second layer 510 advantageously can correspond to a copper (Cu) spacer layer. In a TMR, the second layer 510 advantageously can correspond to a relatively thin tunneling layer of a dielectric, such as alumina ($Al_2O_3$). The third layer 512 advantageously can correspond to a "soft" magnetic layer. In another embodiment, the first layer 508 and the third layer 512 can correspond to the soft layer and the hard layer, respectively. Of course, the magnetoresistive sandwich can further include barrier or cap layers and the like.

In one example, the magnetoresistive sandwich forms a stack that has a total thickness of about 200 Angstroms (Å). In this example, the first layer 508 is about 15 to 20 Å in thickness. A copper (Cu) spacer layer for the second layer 510 is about 30 Å in thickness. The third layer 512 is about 15–20 Å in thickness. The remainder of the stack thickness is occupied by one or more cap layers. As illustrated in FIG. 5D, the magnetoresistive sandwich is deposited relatively uniformly as a sheet over the insulating layer. The portions of the magnetoresistive sandwich that are deposited directly on the bottom surface 505 of the trench 504 later form MRAM cell bodies. In one embodiment, the portions of magnetoresistive sandwich that are deposited on the bottom surface 505 of the trench 504 are slightly thinner at the edges of the trench 504 than in the center of the trench 504, which beneficially reduces the switching power needed to switch a logical state of the MRAM cell. Other portions of the magnetoresistive sandwich are deposited on the remaining portions of the photoresist 506.

Figure 5E:
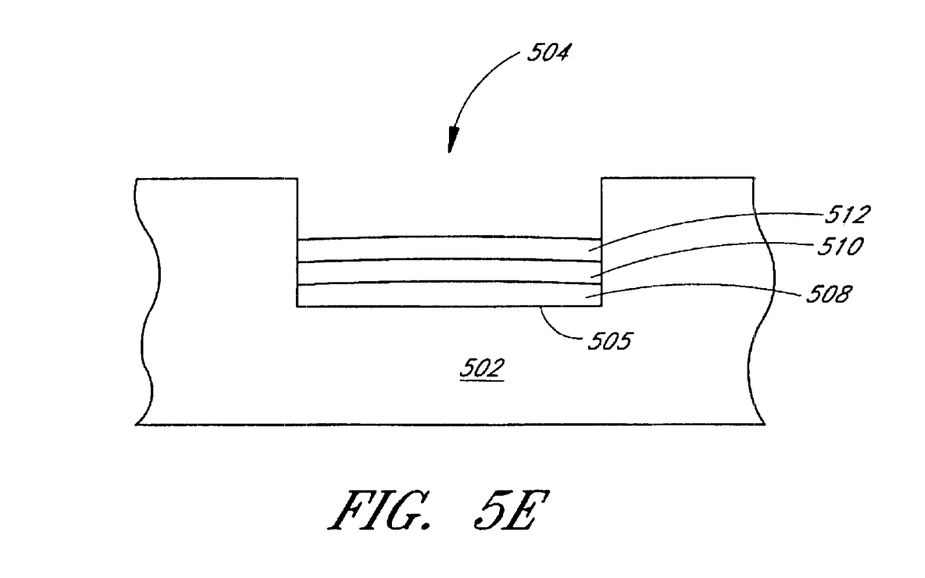
FIG. 5E is a cross-sectional view of the MRAM cell illustrated in FIG. 5D, after a lift-off process.

FIG. 5E is a cross-sectional view of the partially formed MRAM cell illustrated in FIG. 5D, after application of a lift-off process. The lift-off process removes the photoresist 506. The removal of the photoresist 506 also advantageously removes the portions of the magnetoresistive sandwich that were formed on the photoresist 506. The portions of the magnetoresistive sandwich that were deposited in the trench 504 are not removed by the lift-off process because the photoresist 506 was previously removed from the bottom surface 505 of the trench 504. Thus, those portions of the magnetoresistive sandwich adhere to the bottom surface 505 of the trench and remain to form MRAM cell bodies. Advantageously, the MRAM cells are formed without the application of a harmful and relatively time-consuming ion beam milling process to remove undesired portions of magnetoresistive sandwich.

Figure 6:
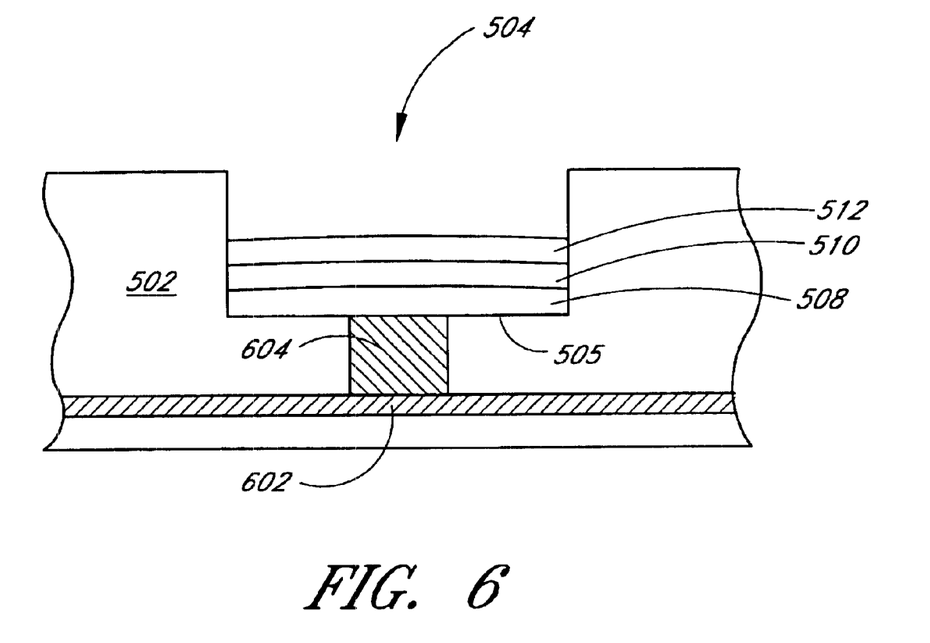
FIG. 6 is a cross-sectional view of a partially formed MRAM with a word line.

FIG. 6 is a cross-sectional view of a partially formed MRAM with a word line 602. The first layer 508, the second layer 510, and the third layer 512 in the trench 504 form the magnetoresistive sandwich of a cell body in the MRAM. A word line can be formed above or below the cell body. In the illustrated embodiment of FIG. 6, the word line 602 is formed below the trench 504 and below the cell body. When the first layer 508, the second layer 510, and the third layer 512 correspond to a TMR configuration, the MRAM can also include a plug 604 that electrically connects the TMR cell body to the word line 602. The plug 604 can be formed from a conductive material, such as tungsten (W). The plug 604 fills an opening or window (also known as a via) that is formed in the insulating layer 502 by, for example, an etching process. In an alternative embodiment (not shown), the first layer 508 is connected directly to the word line 602 through a contact, and the plug 604 is not needed.

Figure 7:
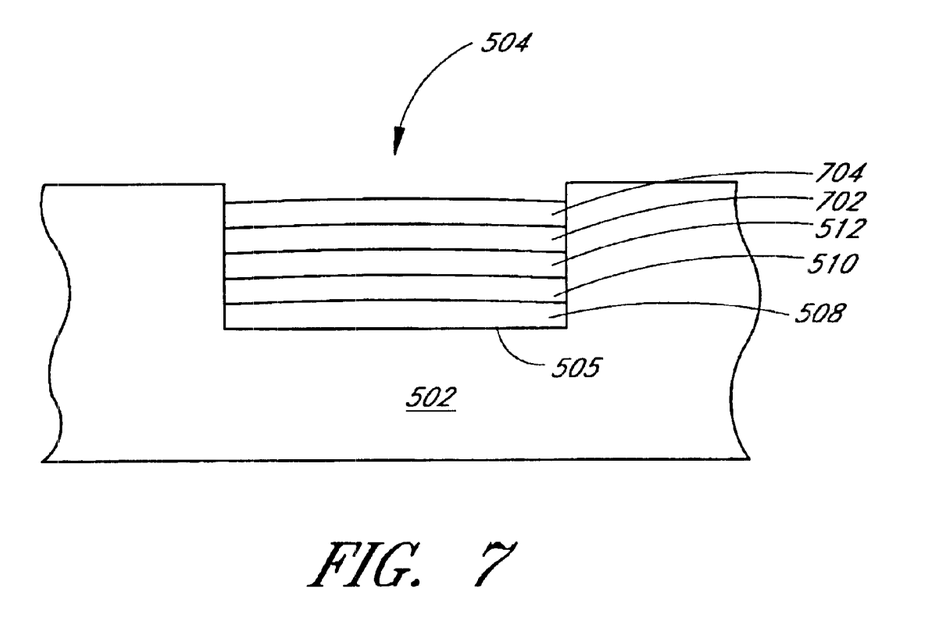
FIG. 7 is a cross-sectional view of a partially formed MRAM with a multiple layer magnetoresistive sandwich.

FIG. 7 is a cross-sectional view of a partially formed MRAM with a multiple layer magnetoresistive sandwich. It will be understood by one of ordinary skill in the art that the number of layers in a magnetoresistive sandwich can correspond to a very broad range. The partially formed MRAM illustrated in FIG. 7 has a magnetoresistive sandwich with 5 layers. The magnetoresistive sandwich includes the first layer 508, the second layer 510, and the third layer 512 described earlier in connection with FIGS. 5D–E and FIG. 6. The magnetoresistive sandwich shown in FIG. 7 further includes a fourth layer 702 and a fifth layer 704. The fourth layer 702 corresponds to another spacer layer, such as a copper (Cu) spacer layer for a GMR application. The fifth layer 704 corresponds to another magnetic layer.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

We claim:

1. A process to produce a cell body in a magnetoresistive random access memory (MRAM), the process comprising:

forming an insulating layer on a substrate assembly;

forming a layer of photoresist over the insulating layer;

removing a portion of the layer of photoresist from a region the cell body is to be produced;

patterning a trench in the insulating layer through the removed portion of the layer of photoresist, where the trench is adapted to accommodate the cell body;

forming a magnetoresistive sandwich on remaining portions of the layer of photoresist and on a bottom surface of the trench; and lifting off the remaining portions of the layer of photoresist such that portions of the magnetoresistive sandwich formed on the photoresist are removed from the substrate assembly.

2. The process as defined in claim 1, further comprising:

forming a word line in the substrate assembly; and forming the insulating layer on top of the word line.

3. The process as defined in claim 1, further comprising:

forming a word line in the substrate assembly;

forming the insulating layer on top of the word line; and opening a window in the insulating layer to the word line such that a portion of the cell body makes electrical continuity with the word line.

4. The process as defined in claim 1, wherein the magnetoresistive sandwich corresponds to a giant magnetoresistance (GMR) sandwich.

5. The process as defined in claim 1, wherein the magnetoresistive sandwich corresponds to tunneling magnetoresistance (TMR) sandwich.

6. The process as defined in claim 1, wherein forming the magnetoresistive sandwich further comprises:

forming a hard layer of magnetic material;

forming a spacer layer; and forming a soft layer of magnetic material.

7. The process as defined in claim 1, wherein forming the magnetoresistive sandwich further comprises:

forming a first layer of magnetic material;

forming a first spacer layer on the first layer of magnetic material;

forming a second layer of magnetic material on the first spacer layer;

forming a second spacer on the second layer of magnetic material; and forming a third layer of magnetic material on the second spacer layer.

8. A process to form magnetoresistive cell bodies in a magnetoresistive random access memory (MRAM) comprising:

forming trenches in an insulating material, where bottom surfaces of the trenches correspond to first regions where magnetoresistive cell bodies are intended to be formed;

forming regions of photoresist in second regions of the insulating material, but not on first regions of the insulating material, where the second regions correspond to regions where magnetoresistive cell bodies are not intended to remain;

forming a sandwich of magnetoresistive materials on both the first regions and the second regions; and lifting off the photoresist to remove the sandwich of magnetoresistive materials from the second regions, the sandwich of magnetoresistive material remaining in the first regions.

9. The process as defined in claim 8, wherein lifting off the photoresist comprises a photoresist stripping process.

10. The process as defined in claim 8, wherein lifting off the photoresist comprises a semiconductor micromachining process.

11. The process as defined in claim 8, wherein the insulating material is silicon nitride.

* * * * *